United States Patent
Chuang et al.

(10) Patent No.: US 6,673,690 B2
(45) Date of Patent: *Jan. 6, 2004

(54) METHOD OF MOUNTING A PASSIVE COMPONENT OVER AN INTEGRATED CIRCUIT PACKAGE SUBSTRATE

(75) Inventors: Jui Yu Chuang, Taichung (TW); Chi-Chuan Wu, Taichung (TW)

(73) Assignee: Siliconware Precision Industries Co., Ltd. (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 19 days.

(21) Appl. No.: 09/560,031

(22) Filed: Apr. 27, 2000

(65) Prior Publication Data

US 2002/0098621 A1 Jul. 25, 2002

(51) Int. Cl.$^7$ ................................................ H01L 21/20
(52) U.S. Cl. ..................... 438/382; 438/381; 438/118
(58) Field of Search ................... 438/106, 612, 438/613, 381, 382, 384, 118; 257/687

(56) References Cited

U.S. PATENT DOCUMENTS 6,153,930 A * 11/2000 Hori ........................... 257/687
6,208,525 B1 * 3/2001 Imasu et al. ................ 361/783
6,238,223 B1 * 5/2001 Cobbley et al. ............ 439/119

OTHER PUBLICATIONS

Tummala R.R. et al.; Microelectronics Packaging Handbook Part II: Semiconductor Packaging 106–107 (2d ed. 1997).*

* cited by examiner

Primary Examiner—John F. Niebling
Assistant Examiner—Christopher W Lattin
(74) Attorney, Agent, or Firm—Peter F. Corless; Steven M. Jensen; Edwards & Angell, LLP

(57) ABSTRACT

A method is proposed for mounting a passive component, such as a resistor or a capacitor, over an IC package substrate, such as a BGA (Ball Grid Array) substrate. Conventionally, the mounting of a passive component over a substrate would result in the undesired existence of a gap between the passive component and the substrate, which could lead to such problems as bridged short-circuit, popcorn effect, and dismounting of the passive component during subsequent processes. As a solution to these problems, the proposed method utilizes an electrically-insulative material, such as epoxy resin, to fill up the gap between the passive component and the substrate. Various techniques can be employed to fill the electrically-insulative material into the gap, including dispensing and stencil printing. Due to the fact that the proposed method allows no gap to be left between the passive component and the substrate, it can help eliminate the drawbacks of the prior art, thus allowing the manufactured IC package to be more assured in quality and more reliable to use.

4 Claims, 4 Drawing Sheets

METHOD OF MOUNTING A PASSIVE COMPONENT OVER AN INTEGRATED CIRCUIT PACKAGE SUBSTRATE

BACKGROUND OF THE INVENTION

1. Field of the Invention

This invention relates to integrated circuit (IC) packaging technology, and more particularly, to a method of mounting a passive component, such as a resistor or a capacitor, over an IC package substrate, such as a BGA (Ball Grid Array) substrate

2. Description of Related Art

An IC package, such as BGA (Ball Grid Array, IC package, is designed to pack an IC device therein so that the IC device can be easily handled and mounted on a circuit board. In the package, the IC device is typically mounted together with some passive components, such as resistors and capacitors, on the substrate.

FIGS. 1A–1B are schematic sectional diagrams used to depict a conventional method of mounting a passive component over an IC package substrate. As shown in FIG. 1A, this IC package is a BGA type which includes a substrate 10, an IC chip 20, a passive component 30, a molded compound 40, and an array of solder balls 50. The IC package configuration of FIG. 1A is conventional and well-known to those skilled in the art of IC packaging, so description thereof will not be further detailed. FIG. 1B shows an enlarged view of the part enclosed in the dashed circle in FIG. 1A where the passive component 30 is mounted. As shown, the substrate 10 has a core portion 102 and a surface-mount portion 10b on which a pair of solder pads 11, 12 are provided; and the passive component 30 is mounted in such a manner that its two ends 31, 32 are electrically bonded by means of solder 12a respectively to the solder pads 11, 12.

One problem to the mounting of the passive component 30 over the substrate 10, however, is that a gap 13 would be undesirably left between the passive component 30 and the substrate 19. The existence of this gap 13 would abuse the following drawbacks during the manufacture of the IC package.

First, during the process for attaching the solder balls 50, the high-temperature condition would cause the solder on the passive component 30 to be partly melted, and the melted solder would then flow into the gap 13 through capillary effect, thus undesirably resulting in a bridged short-circuit between the two ends 31, 32 of the passive component 30. This bridged short-circuit may cause the internal circuitry of the IC chip 20 to be inoperable.

Second, during the compound-molding process, the gap 13 would cause the so-called popcorn effect when subjected to thermal stress, which would undesirably degrade the quality of the overall IC package configuration.

Third, during the compound-molding process, since the passive component 30 is fixed in position over the substrate 10 only by the solder applied to the two ends 31, 32 thereof, it can he easily forced out of position by the impact from the flowing resin used in the compound-molding process. If the impact is large, it can cause dismounting and even electrically disconnection of the passive component 30.

There exists therefore a need in the IC industry for a new method of mounting a passive component over an IC package substrate, which can help eliminate the above-mentioned drawbacks of the prior art.

SUMMARY OF THE INVENTION

It is therefore an objective of this invention to provide a method for mounting a passive component over an IC package substrate, which can help prevent the mounted passive component from being subjected bridged short-circuit.

It is another objective of this invention to provide a method for mounting a passive component over an IC package substrate, which can help prevent the overall IC package configuration from being subjected to popcorn effect.

It is still another objective of this invention to provide a method for mounting a passive component over an IC package substrate, which can help fix the mounted passive component more securely in position over the substrate.

It is yet another objective of this invention to provide a method for mounting a passive component over an IC package substrate, which can help allow the manufactured IC package to be more assured in quality and more reliable to use.

In accordance with the foregoing and other objectives, the invention proposes a new method for mounting a passive component over an IC package substrate. The method of the invention is characterized in the use of an electrically-insulative material, such as epoxy resin, to fill up the gap between the passive component and the substrate. The filling can be performed in two ways: either after or before the passive component is attached.

In the fist case (i.e., filling after the passive component is attached in position), the method of the invention comprises the following steps: (1) providing a pair of solder pads at predefined locations over the substrate; (2) soldering the passive component to the solder pads, with a gap being left between the passive component and the substrate, (3) applying a flowable and curable electrically-insulative material to the periphery of the passive component, and through capillary effect, the flowable and curable electrically-insulative material would fill into the gap between the passive component and the substrate; and (4) curing the filled electrically-insulative material into hardened state.

In the second case (i.e., filling before attaching the passive component), the method of the invention comprises the following steps: (1) providing a pair of solder pads at predefined locations over the substrate; (2) pasting an electrically-insulative material over the area between the paired solder pads to a predetermined thickness that would allows no gap to be left between the passive component and the substrate when the passive component is mounted over the substrate; and (3) soldering the passive component onto the paired solder pads.

Since the method of the invention allows no gap to be left between the passive component and the substrate, it can help eliminate the drawbacks of the prior art, including bridged short-circuit, popcorn effect, and dismounting of the passive component. The invention is therefore more advantageous to use than the prior art.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

In accordance with the invention, four preferred embodiments are disclosed in the following with reference to FIGS. 2, 3, 4A–4B, and 5A–5B respectively.

Figure 1A:
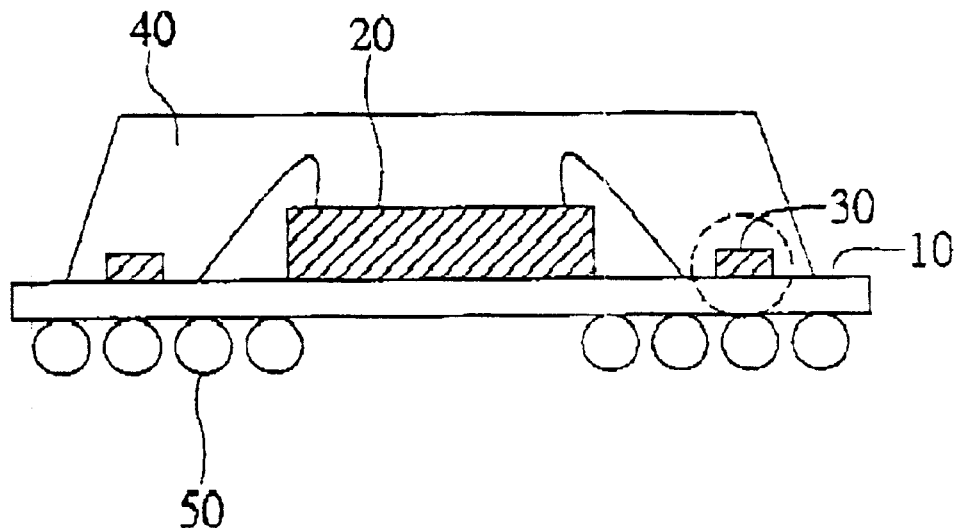
FIG. 1A (PRIOR ART) is a schematic sectional diagram of an IC package configuration.
Figure 1B:
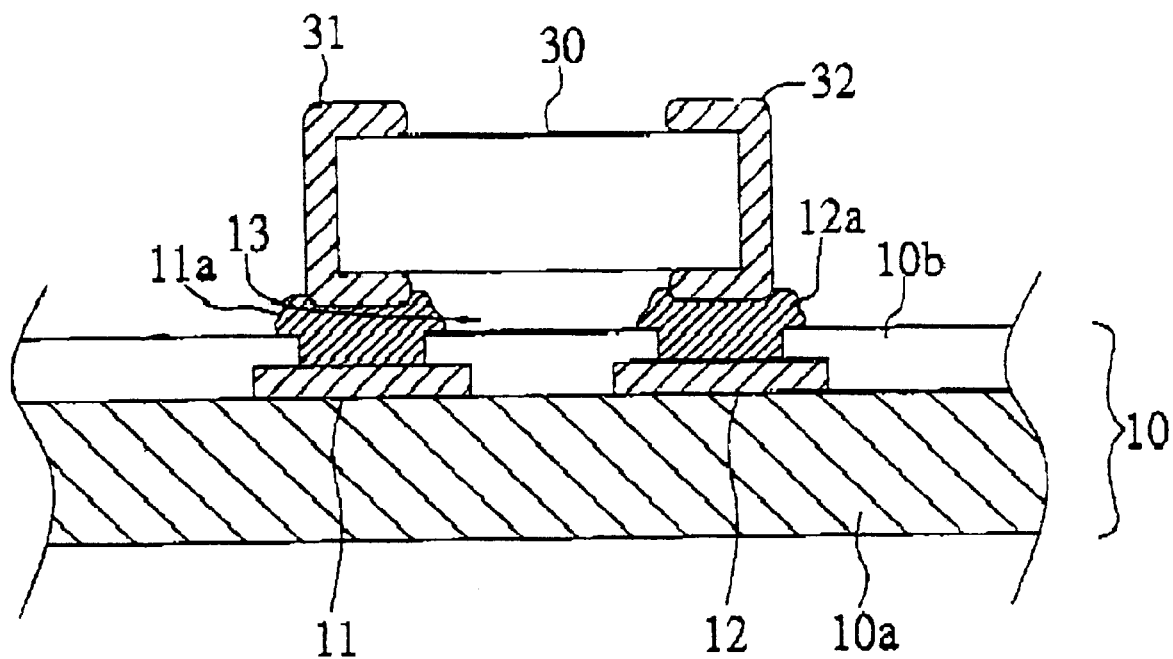
FIG. 1B (PRIOR ART) is a schematic sectional diagram showing an enlarged view of a selected part of the IC package of FIG. 1A where a passive component is mounted.
Figure 2:
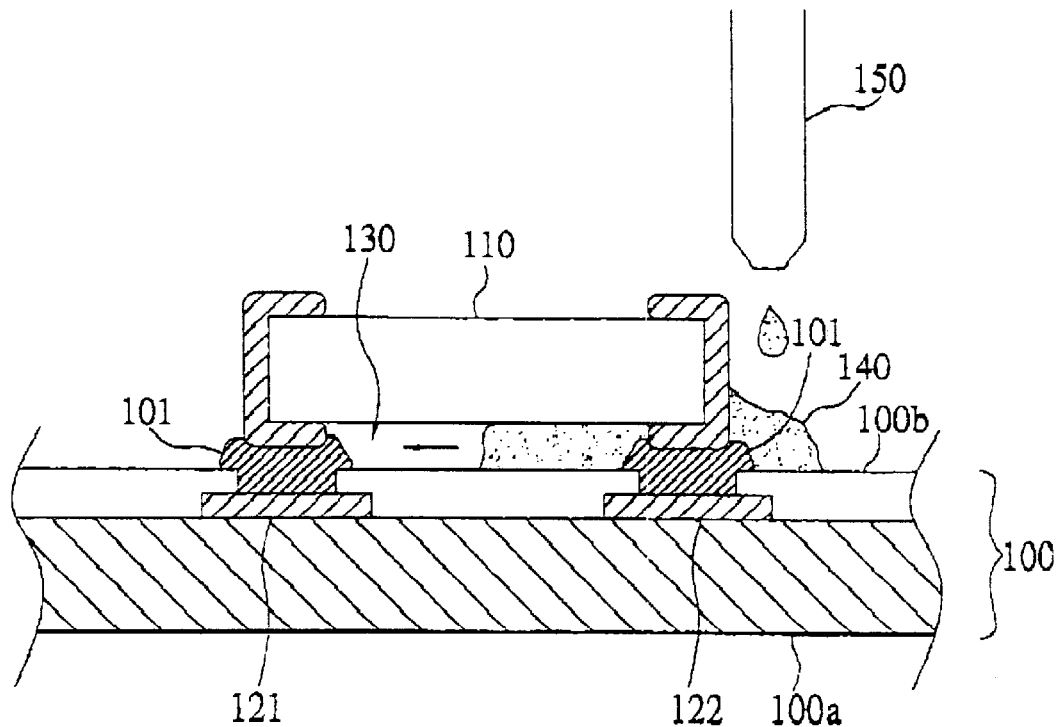
FIG. 2 is a schematic sectional diagram used to depict a first preferred embodiment of the invention for mounting a passive component over an IC package, substrate.

First Preferred Embodiment (FIG. 2)

The first preferred embodiment of the invention is disclosed in full details in the following with reference to FIG. 2.

As shown, this embodiment is used to mount a passive component 110 over an IC package substrate 100 having a core portion 100a and a surface-mount portion 100b on which a pair of solder pads 121, 122 are provided. The passive component 110 is soldered by means of solder 101 onto the paired solder pads 121, 122. As mentioned earlier in the background section on of this specification, a gap 130 world be undesirably left between the passive component 110 and the substrate 100.

It is characteristic step of the invention that a flowable and curable electrically-insulative material 140, preferably epoxy resin, is applied to the periphery of the passive component 110 through the dispensing by a needle 150, and by which the epoxy resin would fill into the entire gap 130 through capillary effect. After the gap 130 is entirely filled with the epoxy resin, a baking process is performed to harden the epoxy resin.

Due to the fact that the invention allows no gap to be left between the passive component 110 and the substrate 100, it can help eliminate the drawbacks of bridged short-circuit and popcorn effect that would otherwise occur in the case of the prior art. Moreover, since the hardened epoxy resin can help increase the adhesion between the passive component 110 and the substrate 100, the passive component 110 can be more securely fixed in position over the substrate 100 than the prior art, thus eliminating the drawback of dismounting of the passive component flat would otherwise occur in the case of the prior art during the compound-molding process.

Figure 3:
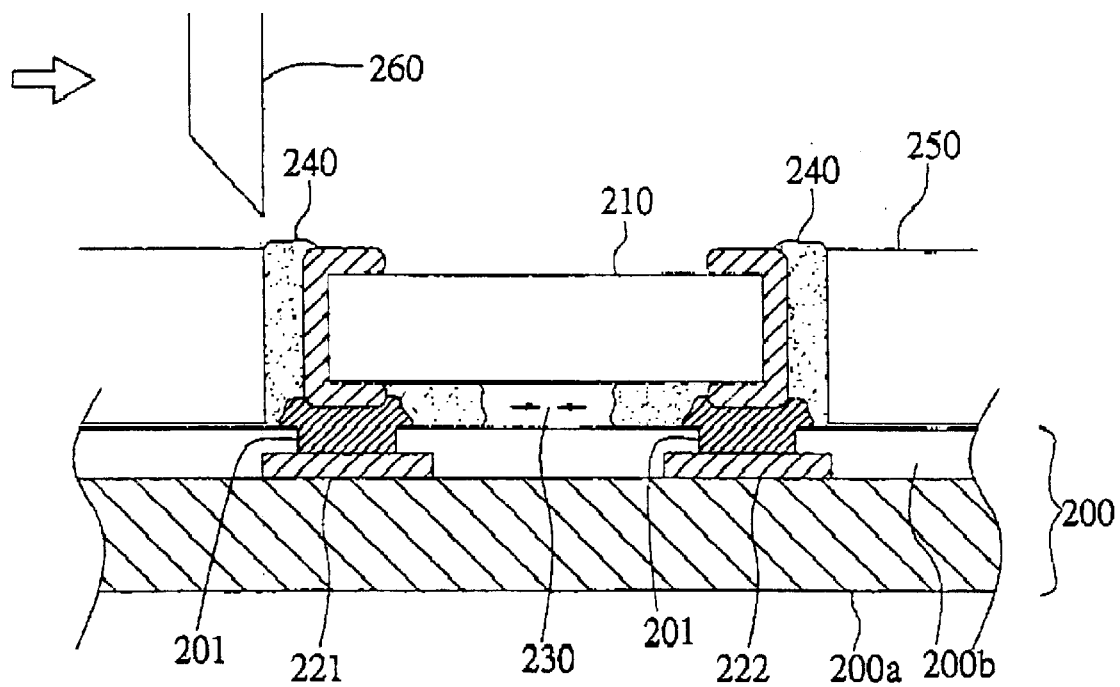
FIG. 3 is a schematic sectional diagram to depict a second preferred embodiment of the invention for mounting a passive component over an IC package substrate.

Second Preferred Embodiment (FIG. 3)

The second preferred embodiment of the invention is disclosed in full details in the following with reference to FIG. 3.

As shown, this embodiment is used to mount a passive component 210 over an IC package substrate 200 having a core portion 200a and a surface-mount portion 20b on which a pair of solder pads 221, 222 are provided. The passive component 210 is soldered by means of solder 201 onto the paired solder pads 221, 222. As mentioned earlier in the background section of is specification, a gap 20 would be undesirably left between the passive component 210 and the substrate 200.

It is characteristic step of the invention that a vacuum stencil-printing process is performed to apply a flowable and curable electrically-insulative material 240, preferably epoxy resin, to the periphery of the passive component 210. During this process, a stencil mask 250 and a glade 260 are employed to help apply the epoxy resin to the periphery of the passive component 210, and by which the epoxy resin a would fill into the entire gap 230 through vacuum sucking and capillary effect. After the gap 230 is entirely filled with the epoxy resin, a baking process is performed to harden the epoxy resin.

Due to the fact that the invention allows no gap to be left between the passive component 210 and the substrate 200, it can help eliminate the drawbacks of bridged short-circuit and popcorn effect that would otherwise occur in the case of the prior art. Moreover, since the hardened epoxy resin can help increase the adhesion between the passive component 210 and the substrate 200, the passive component 210 an be more securely fixed in position over the substrate 200 than the prior art, thus eliminating the drawback of dismounting of the passive component that would otherwise occur in the case of the prior art during the compound-molding process.

Figure 4A:
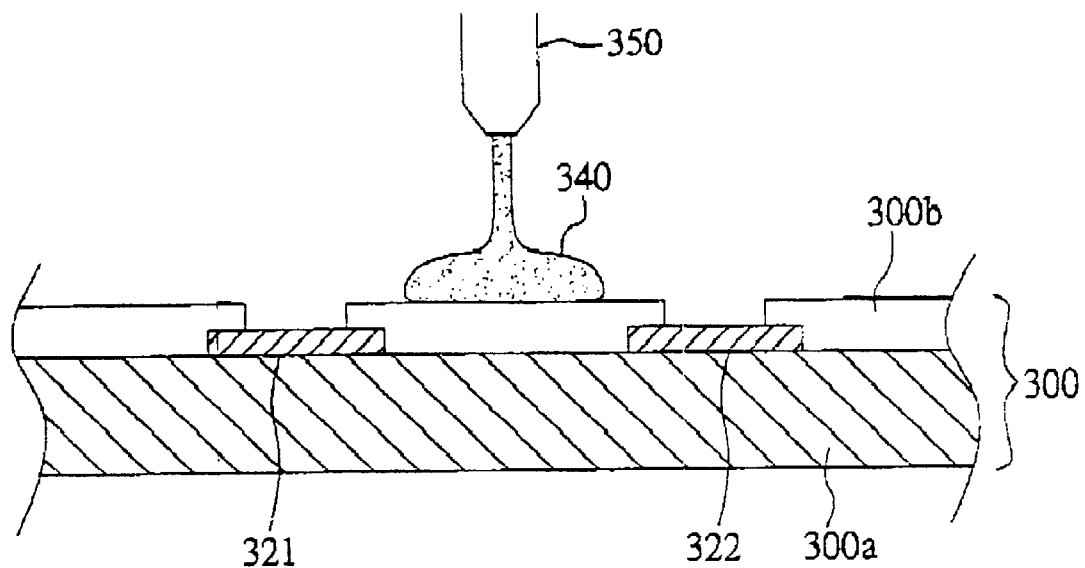
FIGS. 4A–4B is a schematic sectional diagram used to depict a third preferred embodiment of the invention for mounting a passive component over an IC package substrate.
Figure 4B:
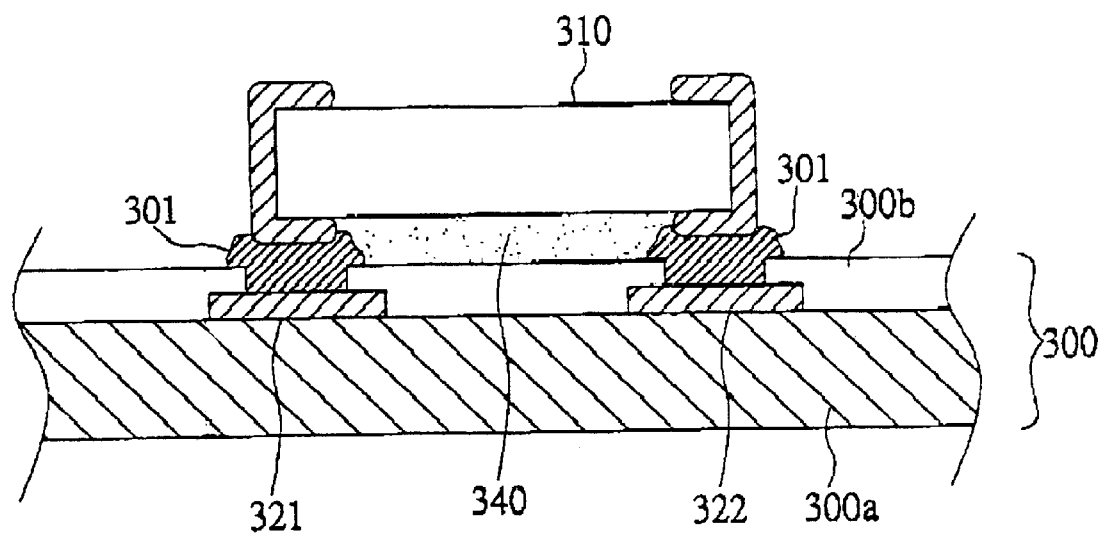

Third Preferred Embodiment (FIGS. 4A–4B)

The third preferred embodiment of the invention is disclosed in full details in the following with reference to FIGS. 4A–4B.

Referring first to FIG. 4A, the first step is to prepare a substrate 300 having a core portion 300a and a surface-mount portion 300b on which a pair of solder pads 321, 322 are provided. Next, it is characteristic step of the invention that an electrically-insulative material 340, such as epoxy resin, is coated onto the area between the paired solder pads 321, 322 through a dispensing process by a dispenser 350.

Referring further to FIG. 4B, the electrically-insulative material 340 is coated to a predetermined thickness substantially equal to the height of the gap that would otherwise exist between the mounted passive component 310 and the substrate 300 if the electrically-insulative material 340 were uncoated. After this, the passive component 310 is soldered onto the paired solder pads 321, 322. Thanks to the precoating of the electrically-insulative material 340 over the area between the paired solder pads 321, 322, no gap would be left between the passive component 310 and the substrate 300.

Due to the fact that the invention allows no gap to be left between the passive component 310 an the spate 300, it can help eliminate the drawbacks of bridged short-circuit and popcorn effect that would otherwise occur in the case of the prior at. Moreover, since the epoxy resin 340 can help increase the adhesion between the passive component 310 and the substrate 300, the passive component 310 can be more securely fixed in position over the substrate 300 than the prior art thus eliminating the drawback of dismounting of the passive component that would otherwise occur in the case of the prior art during the compound-molding process.

Figure 5A:
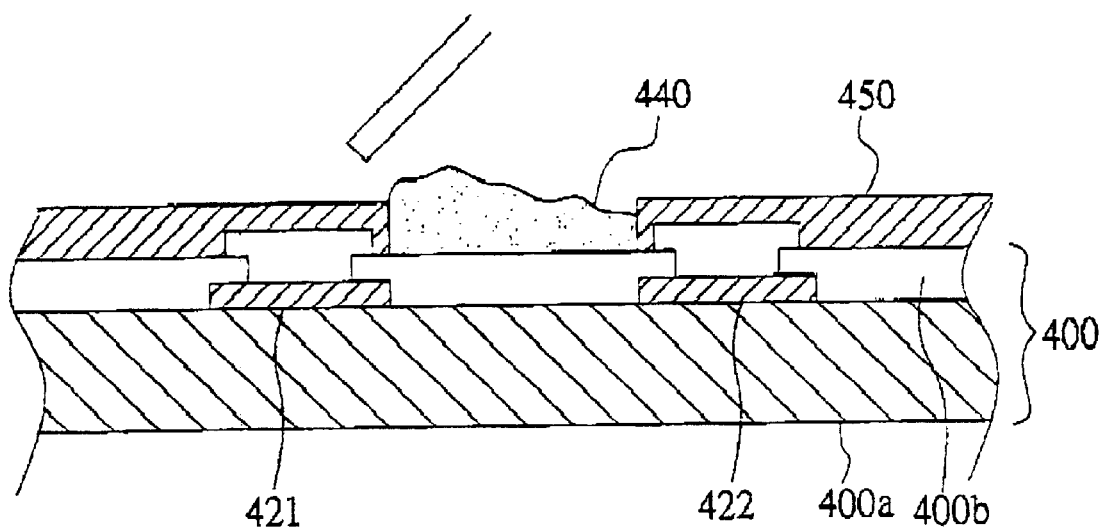
FIGS. 5A–5B are schematic sectional diagrams used to depict a fourth preferred embodiment of the invention for mounting a passive component over an IC package substrate.
Figure 5B:
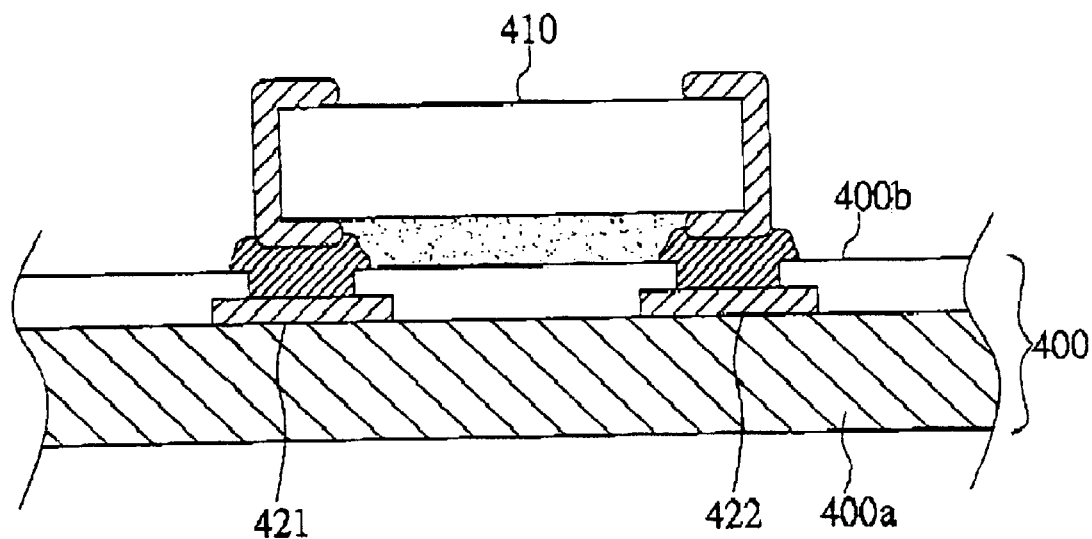

Fourth Preferred Embodiment (FIGS. 5A–5B)

The fourth preferred embodiment of the invention is disclosed in full details in the following with reference to FIGS. 5A–5B.

Referring first to FIG. 5A, the first step is to prepare a substrate 400 having a core portion 400a and a surface-mount portion 400b on which a pair of solder pads 421, 422 are provided. Next, it is characteristic step of the invention that an electrically-insulative material 440, such as epoxy resin, is coated onto the area between the paired solder pads 421, 422 through a stencil-printing process with a stencil mask 450.

Referring further to FIG. 5B, the electrically-insulative material 440 is coated to a predetermined thickness substantially equal to the height of the gap that would otherwise exist between the mounted passive component 410 and the substrate 400 if the electrically-insulative material 440 were uncoated. After this, the passive component 410 is soldered onto the paired solder pads 421, 422. Thanks to the precoating of the electrically-insulative material 440 over the area between the paired solder pads 421, 422, no gap would be left between the mounted passive component 410 and the substrate 400.

Due to the first that the invention allows no gap to be left between the passive component 410 and the substrate 400 it can help eliminate the drawbacks of bridged short-circuit and popcorn effect that would otherwise occur in the case of the prior art. Moreover, since the epoxy resin 440 can help increase the adhesion between the passive component 410 and the substrate 400, the passive component 410 can be more securely fixed in position over the substrate 400 than the prior art, thus eliminating the drawback of dismounting of the passive component that would otherwise occur in the case of the prior art during the compound-molding process.

CONCLUSION

In conclusion, the invention provides a new method for mounting a passive component over an IC package substrate, which is characterized in the use of an electrically-insulative material, such as epoxy resin, to fill up the gap between the passive component and the substrate. Since the invention allows no gap to be left between he passive component and the substrate, it can help eliminate the drawbacks of the prior art, including bridged short-circuit, popcorn effect, and dismounting of the passive component. The invention is therefore more advantageous to use than the prior art.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for mounting a passive component over an IC package substrate having a core portion and a surface-mount portion applied over the core portion, the surface-mount portion being formed with a pair of openings for exposing a pair of solder pads formed at predefined locations on the core portion, wherein a part of the surface-mount portion is situated between the paired solder pads, the method comprising the steps of:

(1) pasting an electrically-insulative material over the part of the surface-mount portion between the paired solder pads to a predetermined thickness that would allow no gap to be left between the passive component and the substrate when the passive component is mounted over the substrate; and (2) after the pasting step, soldering the passive component onto the exposed paired solder pads.

2. The method of claim 1, wherein in said step (1), the electrically-insulative material is epoxy resin.

3. The method of claim 1, wherein in said step (1), the pasting of the electrically-insulative material is carried out through a dispensing process.

4. The method of claim 1, wherein in said step (1), the pasting of the electrically-insulative material is carried out through a stencil-printing process.

\* \* \* \* \*